United States Patent

Tarantino et al.

Patent Number: 5,099,200
Date of Patent: Mar. 24, 1992

[54] I.F. CALIBRATION SYSTEM

[75] Inventors: Joseph F. Tarantino, Seattle; Eric J. Wicklund, Snohomish; Jerry W. Daniels, Everett, all of Wash.

[73] Assignee: Hewlett-Packard Company, Palo Alto, Calif.

[21] Appl. No.: 463,742

[22] Filed: Jan. 12, 1990

[51] Int. Cl.⁵ .................. G01R 23/16; G01R 27/02
[52] U.S. Cl. ............................ 324/619; 324/601; 324/77 CS; 455/226
[58] Field of Search ............ 455/67, 226, 265; 324/619, 77 C, 77 CS, 601

[56] References Cited

U.S. PATENT DOCUMENTS

| | | | |
|---|---|---|---|
| 2,393,856 | 1/1946 | Collins | 455/226 |
| 2,495,997 | 1/1950 | Ames | 455/226 |
| 2,546,248 | 3/1951 | Wynn | 455/226 |
| 3,643,126 | 2/1972 | Hay | 324/77 C |
| 4,232,398 | 11/1980 | Gould | 455/226 |
| 4,447,782 | 5/1984 | Rutkoski | 324/619 |
| 4,451,782 | 5/1984 | Ashida | 324/77 C |
| 4,584,710 | 4/1986 | Hansen | 455/226 |

Primary Examiner—Kenneth A. Wieder
Assistant Examiner—Jose M. Solis

[57] ABSTRACT

To determine the phase and amplitude response of a superheterodyne instrument, a fixed frequency signal is applied to the instrument's signal input port. The superheterodyne local oscillator is then swept to translate the fixed frequency input signal into a sweeping sinusoid that traverses the I.F. passband. Data is acquired as the signal sweeps the passband and is analyzed to determine the phase and amplitude characteristics of the instrument. These characteristics are logged in a memory and are used to remove artifacts of instrument-induced frequency response errors from subsequent measurements.

11 Claims, 2 Drawing Sheets

I.F. CALIBRATION SYSTEM

FIELD OF THE INVENTION

The present invention relates to electronic test instruments, and more particularly relates to a system for characterizing the I.F. passband response of such instruments.

BACKGROUND AND SUMMARY OF THE INVENTION

For expository convenience, the present invention is illustrated with reference to one particular application thereof, namely as a calibration tool for use with a spectrum analyzer. It should be recognized, however, that the invention is not so limited.

A spectrum analyzer typically employs a variety of signal processing stages between the signal input port and the signal analysis stages. These processing stages often include one or more wideband front end amplifiers, one or more mixers, and several stages of I.F. amplification and filtering. While these stages are advantageous in many respects, they unavoidably change, to a greater or lesser degree, the amplitude and phase composition of the original input signal due to their non-unity frequency responses. Most of this change is caused by the I.F. filters, which tend to roll off the amplitude of the signal near the I.F. passband edges and to shift the signal phase as a function of frequency over the bandwidth of the I.F. filter.

In a conventional spectrum analyzer, these phase and amplitude characteristics (referred to here as the instrument's frequency response) are of little concern because the instrument only analyzes signals in the center of its I.F. structure. This limited response is effected by bandwidth resolution filters that, in some instances, have bandwidths of only a few hertz, thereby permitting the instrument to resolve closely spaced signals. (To characterize the spectrum of a broad band signal with such a narrow filter, the instrument sweeps its local oscillator signal so that different spectral components of the input signal pass through the filter. The magnitude of the filtered output signal is presented on a display as a function of time and represents the signal's spectral distribution.) Since the narrow resolution filters are centered in the I.F. passband, the frequency response of the I.F. is of virtually no consequence.

(When the term I.F. is used herein, it should be understood to include all the frequency converting, filtering and amplifying stages between the analyzer input and the detector stages.)

More recently, advances in digital signal processing have permitted broadband signals to be sampled and analyzed coherently, rather than broken down and analyzed in time-sequential fashion in narrow spectral bands. In such instruments, the I.F. passband characteristics become important since they shape the signal spectrum and perturb the phase relationships between its components. Fortunately, it is relatively simple in digital instruments to further process the signal to compensate for these frequency responses. However, they must first be quantified.

In the prior art, this quantization process has taken a number of forms. Most common has been to determine the phase and amplitude response of the instrument input circuitry at one frequency: the center of the I.F. passband. A correction based on this measurement is then applied to all subsequent measurements. Other quantization techniques have sought to quantify the amplitude and phase responses at a variety of frequencies throughout the I.F. One such technique excites the instrument with a pseudo random noise sequence. Another uses a single stepped sinusoid.

The pseudo random noise technique is fast and permits measurement of phase data. However, it provides a generally poor signal-to-noise ratio, which compromises the accuracy of the measurement. The signal-to-noise ratio can be improved somewhat with averaging, but averaging requires additional time, negating the speed advantage.

The stepped sinusoid technique yields very good signal-to-noise ratio, but requires repeated measurements and does not readily provide phase data.

Both the pseudo random noise and stepped sinusoid excitation techniques require additional equipment not generally included with the signal analysis instrument.

It is a primary object of the present invention to provide a method and apparatus for quickly and accurately quantifying the frequency response of an instrument across its entire I.F. passband without use of additional equipment.

Briefly, this object is accomplished in the present invention by exciting the instrument with a fixed frequency signal from a calibration oscillator internal to the instrument. To yield data across the entire I.F. passband, the instrument's local oscillator frequency is swept, translating the fixed input signal to a signal that sweeps the I.F. passband. The instrument's own analysis stages examine the phase and amplitude characteristics of this swept I.F. signal and store the results in a calibration memory for later use.

The foregoing and additional objects, features and advantages of the present invention will be more readily apparent from the following detailed description, which proceeds with reference to the accompanying drawings.

DETAILED DESCRIPTION

Figure 1:
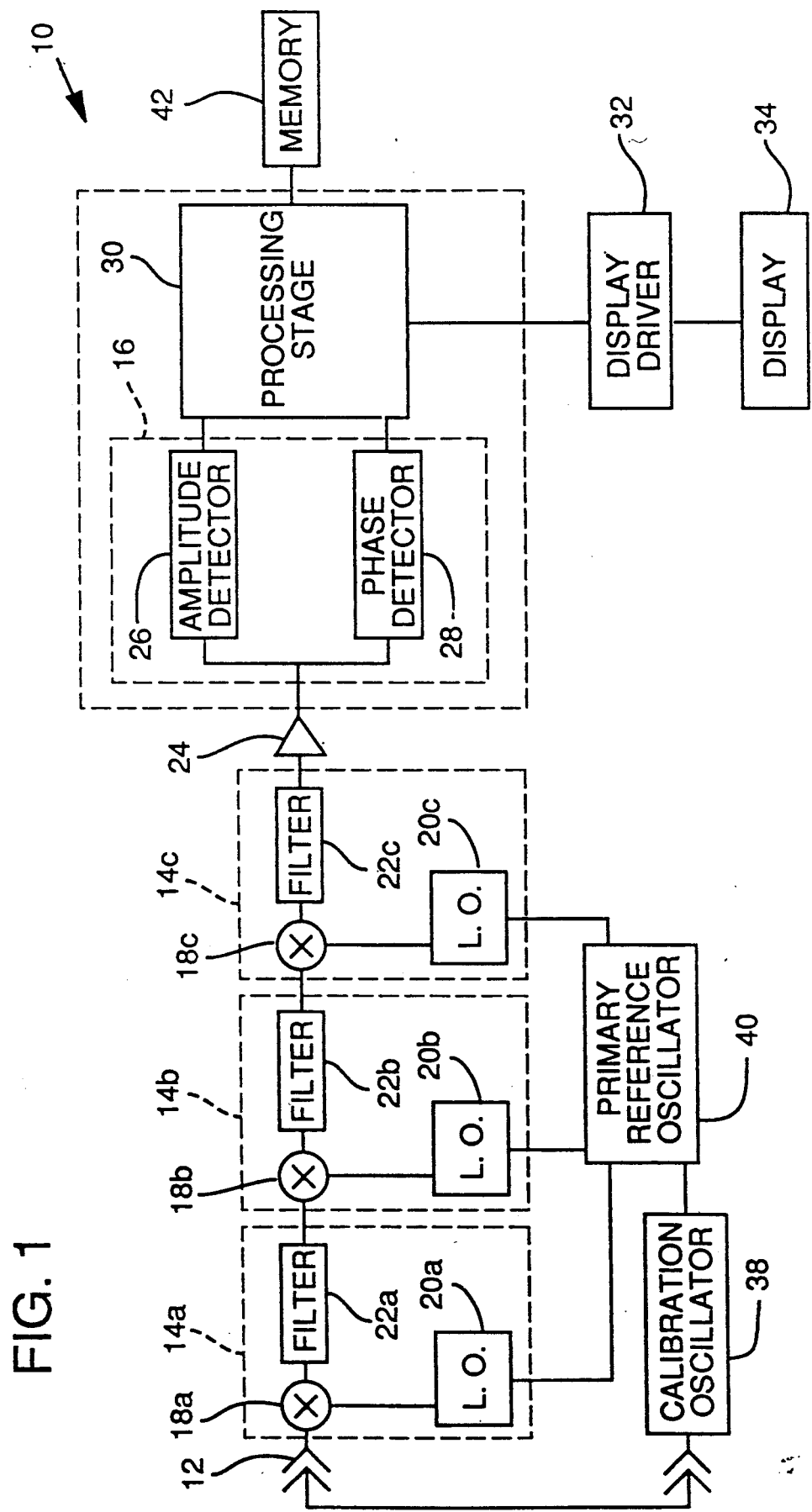
FIG. 1 is a schematic block diagram of an instrument according to one embodiment of the present invention.

Referring to FIG. 1, an illustrative spectrum analyzer 10 includes a signal input port 12, one or more frequency conversion stages 14 and a signal analysis stage 16. The conversion stages 14 each typically include a mixer 18, a local oscillator 20 and a filter 22. Each mixer mixes an input signal with a signal from the associated local oscillator 20 to translate the input signal to an intermediate frequency (I.F.). The filters 22 filter spurious mixer products and image frequencies.

The I.F. signal output by the frequency conversion stages 14 is amplified by an amplifier stage 24 and is then applied to the signal analyzing stage 16. The signal analyzing stage includes an amplitude detector 26 and a phase detector 28, which characterize the composition of the I.F. waveform and provide data corresponding thereto to a processing stage 30 for further analysis. The data after analysis is typically provided to a display driver stage 32 and a display 34 for viewing.

(In actual implementation, the amplitude and phase detectors 26, 28 are not discrete circuits. Instead, they are implemented by digital signal processing circuitry operating in conjunction with the processing circuitry 30 to digitize samples of the I.F. signal, separate the samples into their quadrature components and process the quadrature samples using digital filters and a fast Fourier transform algorithm to yield magnitude or amplitude and phase data. A processor comprised of an integrated digital filter, a TMS320C25 and a MC68000 performs the bulk of these operations.)

The foregoing circuitry and numerous variations thereon are well known in the art, as described, inter alia, in U.S. Pat. Nos. 4,660,150, 4,594,555, 3,916,319 and 3,875,427, and 4,881,191, the disclosures of which are incorporated herein by reference.

In the illustrated spectrum analyzer 10, the first local oscillator 20a includes a Fractional-N synthesizer that can generate swept LO signals of well characterized trajectory (i.e. no discontinuities in phase or frequency). The instrument also includes a stable calibration oscillator 38. These two oscillators, as well as many others in the instrument, are tied to a primary reference oscillator 40 so that the frequency and phase relationships between the various instrument signals are known.

To generate calibration data, the fixed frequency output signal from the calibration oscillator 38 is provided to the instrument input port 12. The frequency of the first local oscillator 20a is then swept linearly versus time to produce an output I.F. signal that sweeps from one edge of the last I.F. passband to the other. This signal is analyzed by the signal analysis stage 16 to characterize its amplitude and phase throughout the swept range.

(While the frequency versus time trajectory in the illustrated embodiment is linear, it should be recognized that a variety of trajectories could be used provided the trajectory is well controlled and does not cause the instrument I.F. structure to respond in a non-linear fashion.)

Since the input signal is phase locked to the primary reference oscillator 40 and since the local oscillator signal is well behaved (i.e. phase continuous), any perturbation in the amplitude or phase of the analyzed I.F. signal must be due to the amplitude and phase response of the I.F. stages. This characterization data is stored in a memory 42 and is used to compensate subsequent measurements.

To illustrate the foregoing, assume the illustrated triple conversion instrument is designed to work with input signals in the range of 0 to 150 MHz. The first local oscillator 20a may be tunable between 310.1875 to 460.1875 MHz to yield a first I.F. of 310.1875 MHz. (That is, if it is desired to analyze an input signal at 0 Hertz, the LO 20a is tuned to 310.1875 MHz; to analyze an input signal at 150 MHz, the LO is tuned to 460.1875 MHz, etc.) The 310.1875 MHz first I.F. is then mixed with a 300 MHz signal from the second local oscillator 20b to yield a second I.F. of 10.1875 MHz. This 10.1875 MHz I.F. signal is then mixed with a 10 MHz signal from the third local oscillator 20c to yield a third and final I.F. centered at 187.5 KHz. The filters 22a-22c throughout the I.F. chain may produce an output I.F. passband of 80 KHz (i.e. from 147.5 to 227.5 KHz in the third and final I.F.).

The translation of an input signal frequency $F_i$ to a third I.F. frequency $F_{IF3}$ may thus be represented as:

$$F_{IF3} = (LO_1 - F_i) - LO_2 - LO_3 \qquad (1)$$

Since the second and third local oscillator signals are fixed at 300 and 10 MHz, respectively, this formula becomes:

$$F_{IF3} = LO_1 - F_i - 310 \; MHz \qquad (2)$$

To characterize the effect these I.F. stages have on the composition of an input signal, the instrument input port 12 is here excited with a 10 MHz signal from the calibration oscillator 38. The first local oscillator is tuned through a range chosen to produce a third I.F. signal that sweeps across the full output I.F. passband (i.e. 147.5 to 227.5 KHz). Solving formula (2) for $LO_1$ reveals that the first LO should be swept from 320.1475 to 320.2275 MHz.

If the swept frequency data taken by this process merely represented a set of discrete data points taken in sequence, this method would not be much better than the stepped sinusoid method mentioned earlier. By virtue of the known relationship between the input signal and the swept LO signal, however, the present invention can determine not only the precise frequencies at which measurements are taken—it can determine the exact time relationships between measured data points as well. This precise knowledge of time and frequency relationships permits anomalous terms inherent in the phase measurements to be removed so that the I.F.'s true amplitude and phase response can be determined.

In the illustrated example (i.e. linear frequency versus time trajectory), the first anomalous term is a parabolic phase-versus-time response term caused by analyzing the phase at different points in the passband at different instants in time. This parabolic term is centered about the center of the I.F. structure and, since the sweep rate is precisely known, can readily be subtracted out.

To illustrate, assume in the above example that the 80 KHz I.F. bandwidth is linearly swept in a period of 0.1 seconds and the swept data, after analysis, yields 400 equally spaced data points. The analyzed data points thus represent the composition of the swept I.F. signal at spacings of 0.2 KHz as taken sequentially at intervals of 0.00025 seconds. Further assume that the measured phase at the first data point is zero and the phase at the second data point is 0.5 radians. The phase difference attributable to the time difference (i.e. the parabolic term) is the frequency difference (0.2 KHz) integrated over the time interval (0.00025 seconds) or 0.314 radians. The remainder of the phase difference (i.e. 0.5−0.314, or 0.186 radians) is due to the effects of instrument front end. Similar calculations are performed for each of the data points to remove the parabolic response term.

The second anomaly is a linear phase term caused by the group delay ($-d\phi/d\omega$) the signal encounters when passing through the I.F. This delay can simply be measured at the center of the I.F. and then be used to remove the linear phase term from subsequent measurements.

Finally, it is generally desirable to normalize the measured phase response of the I.F. so that it has a value of zero at the center frequency. A constant phase term can be added or subtracted as necessary to achieve this result.

It will be recognized that the phase data gathered by the instrument is generally bounded in the range of $-\pi$ to $\pi$ and "wraps around" as it exceeds this range. To accurately quantify the phase characteristics of the filter, this data is desirably "unwrapped" so that it is no longer bounded by this range. To unwrap this data without ambiguity, the phase difference between adjacent data points is desirably kept to less than $\pi$ radians. This $\pi$ radians limit constrains the speed at which the sweep can be made, but still permits a very fast measurement.

Figure 2:
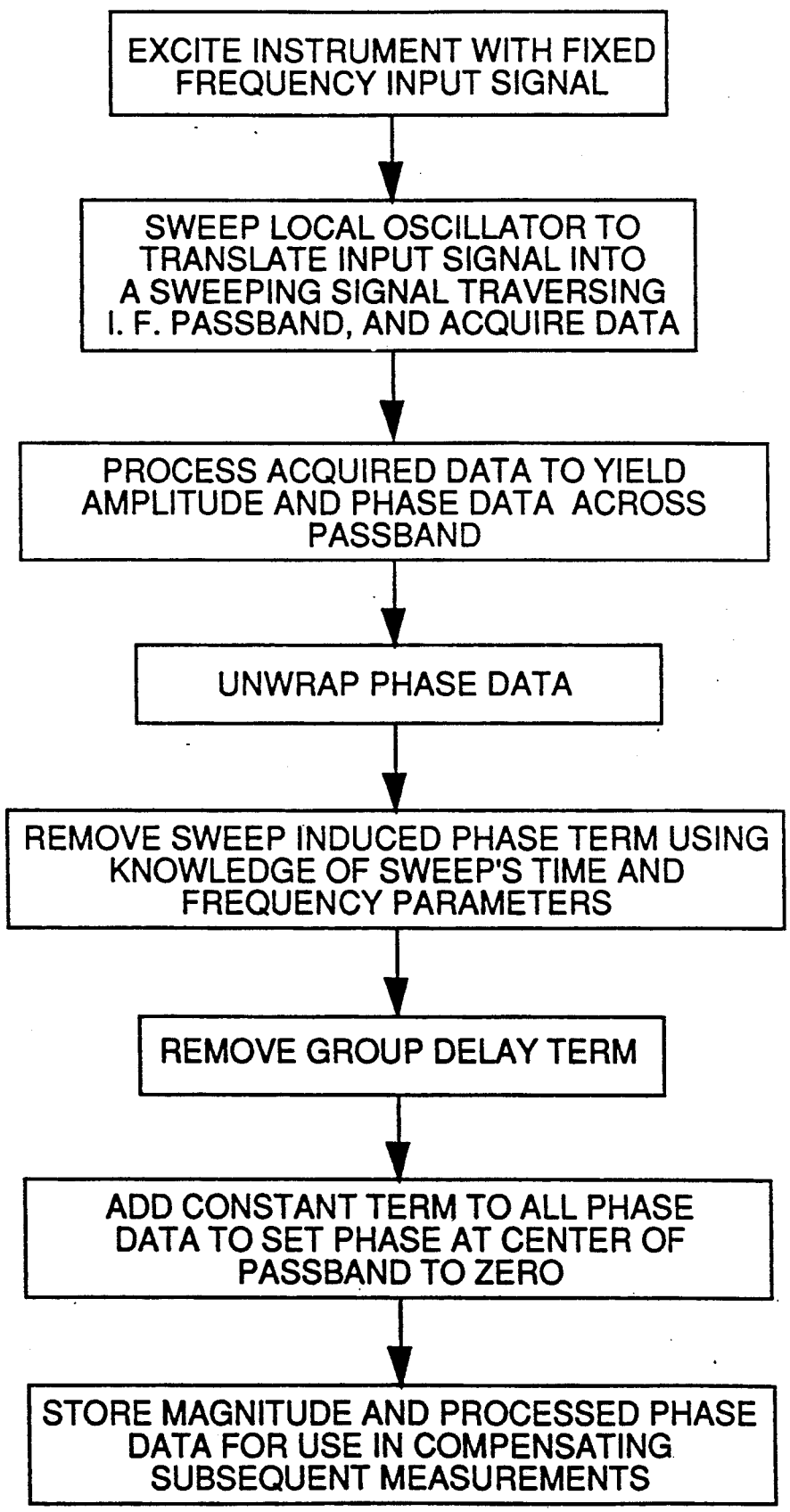
FIG. 2 is a flow chart of a data processing method employed by the apparatus of FIG. 1.

FIG. 2 is a flow chart summarizing the above-described methodology.

In certain circumstances, the results of the swept measurement can be influenced by the direction of the sweep. In such cases, the process can be repeated with the direction of sweeping reversed, thereby permitting cancellation of the errors.

After the final I.F. characterization data is stored in the memory 42, it is recalled to yield phase and amplitude correction factors for all subsequent measurements. By using interpolation techniques, additional data points for frequencies other than those stored in the memory 42 can be generated as needed for subsequent measurements involving different frequency spans.

The above-described process can be accomplished with one sweep of the I.F. bandwidth and need not be repeated unless the response changes significantly over time or with changes in environmental conditions.

Having illustrated the principles of our invention with reference to a preferred embodiment, it will be apparent that the invention can be modified in arrangement and detail without departing from such principles. For example, while the illustrated embodiment has been described as acquiring both phase and amplitude calibration data in a single sweep, in other embodiments it may be desirable to acquire these data in two different sweeps.

In view of this and the wide variety of other embodiments to which the principles of our invention may be applied, it should be recognized that the illustrated embodiment is to be considered illustrative only and not as limiting the scope of our invention. Accordingly, we claim as our invention all such modifications as may come within the scope and spirit of the following claims and equivalents thereto.

We claim:

1. A method of characterizing the I.F. response of an instrument, the instrument including a mixer to which a local oscillator signal is applied for converting an input signal to an I.F. signal, the method comprising the steps:
   providing a fixed frequency input signal to the instrument;
   sweeping the local oscillator signal from a first frequency to a second frequency;
   deriving the input signal and the swept local oscillator signal from a common reference oscillator; and
   measuring an I.F. signal produced thereby.

2. A method of characterizing the I.F. response of an instrument, the instrument including a front end, a mixer, and a local oscillator for converting an input signal applied to the front end to an I.F. signal, the method comprising the steps:
   providing a reference oscillator, a local oscillator and a calibration oscillator;
   phase locking the local oscillator and the calibration oscillator to the reference oscillator so the frequency and phase relationships therebetween are determinable;
   applying an output signal from the calibration oscillator to the instrument front end;
   sweeping the frequency of the local oscillator relative to the calibration oscillator to produce a sweeping I.F. signal;
   processing the I.F. signal to separate its quadrature components; and
   analyzing said quadrature components to determine the amplitude and phase of the I.F. signal at a plurality of frequencies across a swept portion of the I.F. band.

3. The method of claim 1 which further includes the step:
   providing a sinusoidal signal from a reference oscillator internal to said instrument as the fixed frequency input signal.

4. A method of characterizing the I.F. response of an instrument, the instrument including a mixer to which a local oscillator signal is applied for converting an input signal to an I.F. signal, the method comprising the steps:
   providing a fixed frequency input signal to the instrument;
   sweeping the local oscillator signal from a first frequency to a second frequency; and
   measuring an I.F. signal produced thereby;
   wherein the method further includes sweeping the local oscillator signal from the first frequency to the second frequency with a precisely known trajectory, and processing the measured I.F. signal to subtract out a phase versus time component corresponding to said trajectory.

5. A method of characterizing the I.F. response of an instrument, the instrument including a mixer to which a local oscillator signal is applied for converting an input signal to an I.F. signal, the method comprising the steps:
   providing a fixed frequency input signal to the instrument;
   sweeping the local oscillator signal from a first frequency to a second frequency;
   measuring an I.F. signal produced thereby; and
   processing the measured I.F. signal to subtract out a linear phase term introduced by delay through the I.F.

6. A method of characterizing the I.F. response of an instrument, the instrument including a mixer to which a local oscillator signal is applied for converting an input signal to an I.F. signal, the method comprising the steps:
   providing a fixed frequency input signal to the instrument;
   sweeping the local oscillator signal from a first frequency to a second frequency;
   measuring an I.F. signal produced thereby;
   sweeping the local oscillator signal a second time, from the second frequency to the first frequency;
   measuring a second I.F. signal produced thereby; and
   processing said first and second measured I.F. signals to remove any term dependent on the direction of frequency sweep.

7. The method of claim 1 which further includes the steps:
   providing a sinusoidal signal from a reference oscillator internal to the instrument as the fixed frequency input signal; and
   sweeping the local oscillator signal from the first frequency to the second frequency with a precisely known trajectory, and processing the measured I.F. signal to subtract out a phase versus time component corresponding to said trajectory.

8. The method of claim 7 which further includes:

sweeping the local oscillator a second time, from the second frequency to the first frequency;

measuring a second I.F. signal produced thereby; and processing said first and second measured I.F. signals to remove any term dependent on the direction of sweep.

9. A method of characterizing the I.F. response of an instrument, the instrument including a mixer to which a local oscillator signal is applied for converting an input signal to an I.F. signal, the method comprising the steps:

providing a fixed frequency input signal to the instrument;

sweeping the local oscillator signal from a first frequency to a second frequency to yield a sweeping I.F. signal;

processing the I.F. signal to separate its quadrature components; and analyzing said quadrature components to determine the amplitude of the I.F. signal at a plurality of frequencies across a swept portion of the I.F. band.

10. The method of claim 9 which further includes the step:

analyzing said quadrature components to additionally determine the phase of the I.F. signal at a plurality of frequencies across the swept portion of the I.F. band.

11. A method of characterizing an instrument response, the instrument including a mixer and a local oscillator for converting an input signal to an I.F. signal, the method comprising the steps:

providing a sinusoidal signal from a reference oscillator internal to the instrument as a fixed frequency input signal;

deriving said sinusoidal signal and the swept local oscillator signal from a common reference signal so the relationships therebetween are known;

sweeping the local oscillator from a first frequency to a second frequency with a precisely known trajectory, and processing an I.F. signal produced thereby to subtract out a phase versus time component corresponding to said trajectory;

processing the I.F. signal to separate its quadrature components; and analyzing said quadrature components to determine the amplitude and phase of the I.F. signal at a plurality of frequencies across a swept portion of the I.F. band.

* * * * *